United States Patent

Studnick

[15] 3,657,508

[45] Apr. 18, 1972

[54] METHOD OF AND RADIANT ENERGY TRANSMISSIVE MEMBER FOR REFLOW SOLDERING

[72] Inventor: William R. Studnick, Cicero, Ill.

[73] Assignee: Western Electric Company, Incorporated, New York, N.Y.

[22] Filed: Nov. 18, 1070

[21] Appl. No.: 90,709

[52] U.S. Cl. ....... 219/85, 219/347
[51] Int. Cl. ....... B23k 1/04
[58] Field of Search ....... 219/85, 347, 349354, 411

[56] References Cited

UNITED STATES PATENTS

| | | | |
|---|---|---|---|
| 3,529,117 | 9/1970 | Costello | 219/85 |
| 3,509,317 | 4/1970 | Valsamakis et al. | 219/347 Y |
| 3,469,061 | 9/1969 | Costello | 219/85 |
| 3,374,531 | 3/1968 | Bruce | 219/347 UX |
| 3,486,223 | 12/1969 | Butera | 29/626 |

*Primary Examiner*—J. V. Truhe
*Assistant Examiner*—L. A. Schutzman
*Attorney*—W. M. Kain, R. P. Miller and A. C. Schwarz, Jr.

[57] ABSTRACT

A radiant energy transmissive member, such as of quartz, is formed with a plurality of peculiarly contoured grooves therein to accommodate, align and facilitate the simultaneous reflow soldering of a plurality of wires or leads to aligned and preferably solder-coated elements, such as circuit path extremities on a printed circuit board. Each groove is contoured such that the solder confined therein, when heated to a molten state, will be drawn at least in part by capillary attraction over the top of the associated wire or lead, with the solder merging on either side with the adjacent element so as to form a reliable fillet-shaped reflow solder connection. Also, by masking one surface of the quartz member so as to be selectively opaque, the radiant energy can be directed more precisely in accordance with a resultant transparent pattern only specific areas to be heated.

18 Claims, 9 Drawing Figures

INVENTOR
W.R.STUDNICK

BY [signature]
ATTORNEY

METHOD OF AN RADIANT ENERGY TRANSMISSIVE MEMBER FOR REFLOW SOLDERING

BACKGROUND OF THE INVENTION

1. Field of the Invention

This invention relates to radiant energy soldering and, more particularly, to a method of and a radiant energy transmissive member with peculiarly contoured grooves formed therein for effecting multiple, simultaneous reflow solder connections between overlying portions of two or more elements to be bonded together.

2. Description of the Prior Art

The increasing trend toward micro-miniaturization and high density packaging in the electronics industry has created an urgent need for a method of soldering a plurality of extremely fine wires or leads to terminals, pads or land areas of printed circuit boards, for example, in a reliable, efficient and economical manner.

Conventional heated-tip pin-point soldering and resistance welding have not proven very effective for many micro-miniaturized applications, primarily because of space limitations. Such prior art techniques, of course, are also neither efficient nor economical for mass production applications.

Flow solder techniques have also often proven to be inapplicable with respect to effecting multiple solder connections on miniaturized circuitry because of so-called bridging (short circuit) problems encountered as a result of the close spacing of the connections, and also because of the exposure of the entire circuit to possible deleterious heat.

Electron beam welding overcomes many of the aforementioned problems, such as those relating to space limitations and heat dissipation, but has the disadvantage of necessitating pin-point bonding or soldering of a plurality of connections successively rather than simultaneously. This, of course, also prevents problems with respect to achieving accurate alignment of the beam relative to the connections to be bonded, particularly on an automated basis. Electrons beam welding also inherently involves the generation of very high energy, localized heating which is capable of damaging not only the members to be joined, but polymeric type circuit board substrates.

In view of the foregoing, radiant energy heating has become another more recent technique used particularly in mass soldering or bonding applications. Radiant energy heating affords the following selective advantages over prior techniques: obviates the need for directly heated needle-point members to be brought into contact with the elements to be bonded or soldered; allows the radiant energy to be highly focused and/or masked so as to impinge on only precisely defined areas, such as a line or point; requires inexpensive shielding; generages heat very rapidly; and has an absorption characteristic that varies as a function of a given materials emissivity. This latter characteristic may advantageously be used to establish a desirable temperature distribution between two or more heated elements made of different materials.

In radiant energy soldering or bonding applications heretofore, however, the radiant energy has been employed to either heat an enclosed chamber within which the elements to be joined are positioned, or the radiant energy has been transmitted, preferably in a focused pattern, through a suitable plate-shaped transmissive member, such as of quartz, to the area to be heated. Such a member has normally simply consisted of a rectangular, planar member that simultaneously functioned as a heat sink and a biasing member. In order to focus radiant energy into specific patterns, as distinguished from focal point lines, highly polished and rather expensive metal shields have also been employed heretofore in conjunction with the radiant energy generating and elliptically shaped reflector focusing systems.

SUMMARY OF THE INVENTION

An object of the present invention is to provide a new and improved method of and a specifically contoured radiant energy transmissive member for use in making reflow solder connections.

Another object of the present invention is to align and confine a spaced array of sets of mating elements, and to simultaneously effect multiple reflow solder connections between the elements of the respective sets through the application of both concentrated radiant energy heat and capillary attraction flow of the solder while in a molten state in the connection areas.

A further object of this invention is to provide a method of and a thermally conductive radiant energy transmissive member for use in making multiple, simultaneous reflow solder connections between sets of leads and mating terminals formed in a spaced array, with the member not only functioning as a heat sink, but having a plurality of peculiarly shaped lead aligning and confining grooves formed therein which causes the solder, when heated to a molten state by the radiant energy, to be drawn over the respective leads at least in part by capillary attraction to form reliable, fillet-shaped reflow solder connections between each mating lead and terminal.

It is an additional object of this invention to mask a radiant energy transmissive member so as to be selectively opaque, the unmasked areas thereby defining a precise transparent pattern through which the radiant energy may be directed to the areas intended to be heated.

It is still another object of the present invention to produce a reflow solder connection between mating metallic elements, at least one of which has a plastic insulating covering thereon, through the application of radiant energy generated heat capable of producing a desired temperature distribution between the insulation, mating metallic elements and solder, so as to volatilize the insulation in the region of the elements intended to be soldered, while simultaneously effecting a reflow solder connection of the metallic elements.

In accordance with the principles of the present invention, the radiant energy is focused and directed through an infrared transmissive member, such as of quartz, which is constructed in a preferred embodiment for use in making multiple, simultaneous reflow solder connections or bonds between a plurality of wires or leads and solder-coated terminals or pads on printed circuit boards and the like. In the interest of brevity hereinafter, reference will simply be made to "leads" and "-terminals" in describing the various illustrative embodiments and applications of reflow soldering, all of which are only intended to be representative of the principles involved in accordance with the present invention.

A plurality of peculiarly shaped grooves are formed in the base of the quartz member to respectively accommodate and align, in one illustrative application, a plurality of leads relative to a plurality of associated mating solder coated terminals. The grooves are contoured such that when radiant energy is directed through the quartz member so as to impinge upon the respective solder coatings, the leads will be forced initially, by the weight of the member alone or in combination with an externally applied force, to penetrate the surface and overcome the surface tension of the molten solder. Thereafter, the solder is drawn, at least in part, by capillary attraction over the top of each lead confined within a given groove in such a manner as to form a fillet-shaped reflow solder connection between the lead and mating terminal.

As the temperature of a given material heated by infrared radiation varies as a function of the material's emissivity, a desirable temperature distribution can be established such that a portion of the insulation on insulated wire leads can be volatilized to provide stripped ends, for example, at a much higher temperature than that desired and simultaneously generated in the molten solder and lead cores. In other words, the infrared radiant energy is advantageously absorbed at a much faster rate by the plastic material, such as polyurethane, than by the much more reflective solder.

The quartz member can also advantageously be selectively masked to be opaque, thereby forming a resultant precise transparent pattern through which the radiant energy may be transmitted to only specific areas intended to be heated.

The quartz member, in addition, serves as an effective heat sink for conducting heat away from a supporting substrate as well as away from any circuit components that may be positioned immediately adjacent the respective leads and terminals to be permanently solder connected. The elongated ribs or legs formed by the adjacent lead confining grooves also prevents the formation of solder bridges or shorts which otherwise could be formed by the solder when in a molten state. This has proven to be a particularly troublesome problem in the assembly of micro-miniaturized circuitry heretofore.

DETAILED DESCRIPTION

Figure 1:
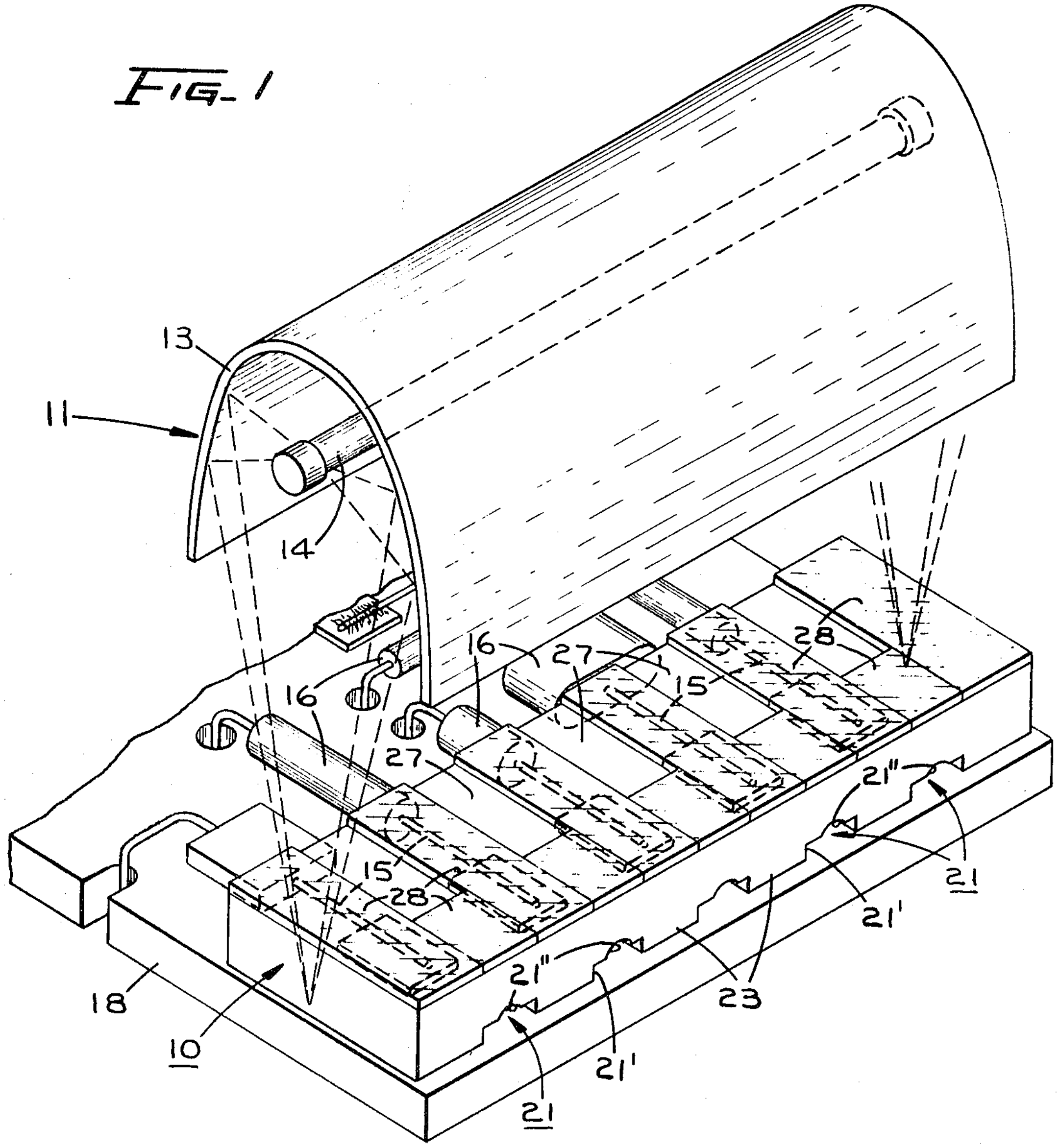
FIG. 1 is a perspective view of a radiant energy, reflow soldering system in accordance with one preferred embodiment of the present invention, a fragmentary portion of a typical printed circuit board, including component lead-circuit board terminal connections being illustrated in combination to represent a typical reflow soldering application.

In accordance with the principles of the present invention, and with specific reference to FIG. 1, a radiant energy reflow soldering system comprises a peculiarly constructed radiant energy transmissive member 10, such as of quartz, and a radiant energy heating unit 11. The heating unit preferably comprises a highly polished cylindroidal reflector 13 and an elongated radiant energy source, such as a tubular, infrared tungsten iodine lamp 14, capable of generating infrared radiation at temperatures of the order of 3,400° K. A cylindroidal reflector, as defined herein, is one formed by a segment of a cylinder having an elliptical right section. The radiant energy generating lamp is positioned along the line defined by one focus of the elliptical right section reflector, with the radiant energy thereby being focused along the line defined by the other focus of the reflector. The infrared radiant energy rays are thereby reflected by the reflector into a substantially straight line focal zone. This concentrated heating zone is advantageously adjusted in one preferred application to coincide, for example, with overlapped leads 15, of electrical components and/or devices 16, and terminals 17 to be reflow soldered on a circuit board 18.

While a reflector having the geometry described above is particularly useful in practicing the invention in many applications, it should be understood that other geometries may be similarly employed in diverse applications, with the particular choice being dictated by specific requirements appreciated by one skilled in the art.

The elongated quartz lamp is preferably of the tungsten iodine type capable of producing radiant energy having a wave length in the range of 0.3 to 5.0 microns. Other sources of radiant energy such as a carbon arc, plasma generator, or heated filament, as well as others of similar types, may also be suitable with respect to a particular soldering application.

Figure 2:
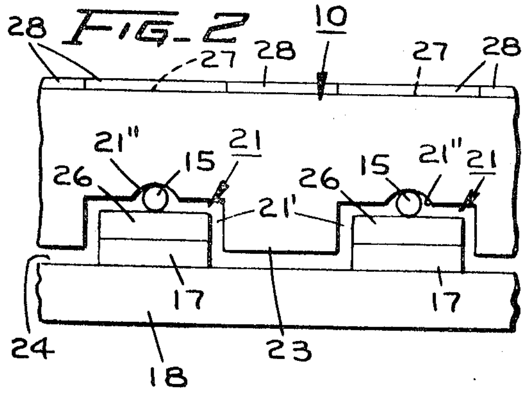
FIGS. 2 and 3 are enlarged, partial side elevational views of the radiant energy transmissive reflow soldering member illustrated in FIG. 1, with FIG. 2 illustrating the relationship of the transmissive member with respect to a pair of leads and associated solder-coated terminals of a printed circuit board prior to being reflow soldered, and FIG. 3 illustrating the same relationship after completion of a reflow solder connection.
Figure 3:
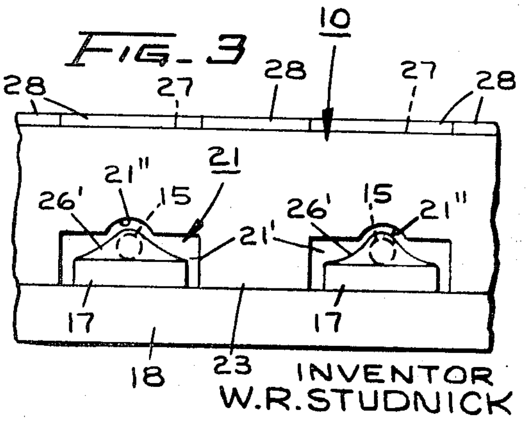

With specific reference to the radiant energy transmissive member 10, it preferably is composed of quartz because of its high infrared radiant energy transmitting efficiency, and excellent thermal conductance characteristics, the latter allowing the member 10 to also function as a very effective heat sink. As best seen in FIGS. 2 and 3, a plurality of lead confining and aligning elongated grooves 21 are formed in the bottom surface of member 10. These grooves in the embodiment of FIGS. 1—3 are each formed with an outer region 21′ of rectangular cross-section and an inner central dome-shaped or concave region 21″. The width, depth and degree of curvature of each groove 21 is dimensioned such that a lead 15 of a component 16, for example, will initially contact and partially support the member 10 so that the lower base or leg portions 23 thereof are positioned in free-spaced relationship with respect to the upper surface of the printed circuit board 18. This spaced relationship best seen in FIG. 2, wherein the space in question is identified by the numeral 24, insures that the member 10 will exert downward force on the leads 15 at least until the latter have penetrated the solder while in a molten state.

Another factor involved in properly dimensioning the width, depth and degree of curvature of each groove 21 is that sufficient head room or space must be provided so as to allow the solder, while heated to a molten state, to be drawn at least in part by capillary attraction over the top of and completely envelop the confined lead, as illustrated in FIG. 3. To accomplish such reflow solder action, the width of the rectangular regions 21′ of the grooves 21 advantageously need not be precisely dimensioned to accommodate the width dimension of the respectively aligned terminals 17. This follows because the wetting action of the solder on the normally precious-metal-coated upper surface of each terminal inherently causes the molten solder to tenaciously adhere to only that surface and the mating lead. In fact, even without a lead positioned within a given groove, the layer of solder when heated to a molten state will tend to gravitate toward the center line of the terminal and form a fillet-shaped profile, albeit it would be more shallow than if a lead were present and encapsulated therein. Accordingly, even an appreciable space between either or both edges of a given terminal and the adjacent side wall(s) defining a portion of the region 21′ in the member 10 will normally present no adverse effects. This, of course, considerably relaxes the stringent center-line to center-line spacing tolerances otherwise required between terminals.

It is thus seen that capillary attraction flow of the solder is effected in accordance with the methods and apparatus of the present invention through the utilization of a peculiarly shaped and properly dimensioned lead confining groove 21 in the radiant energy transmissive member 10, and the combination of radiant heat transmitted through and force produced by the weight of member 10 alone, or in conjunction with an externally applied force. In any event, the application of heat and force will initially cause the member 10 to start to move downwardly slowly as the solder attains a molten state, with the central concave regions 21″ of the grooves 21 forcing the respective leads 15 confined therewithin to penetrate the surface oxide and overcome the surface tension of the molten solder 26.

During further downward movement of the member 10, a space develops between each lead 15 and the previously contacting wall area of the associated groove 21. This space increases as each lead gravitates downwardly within molten solder until the lead finally contacts the upper surface of the aligned terminal. During this time, there is also relative downward movement of the member 10 until the leg portions 23 thereof abut against upper mating surfaces of the circuit board 18.

To dimension the grooves 21 and leg portions 23 so as to establish the desired initial and final spatial relationship between the member 10, leads 15, terminals 17 and circuit board 18, the thickness of the terminals 17, as well as of the solder coating 26, must be taken into account. The layer of solder, of course, could be applied to the terminals and/or the leads in any one of a number of conventional ways, such as by plating, or could be interposed between the leads and terminals in some other suitable way, such as through the use of a pre-formed solder strip.

By way of example only, the height of the leg portions 23 of member 10, as defined by the depth of the rectangular regions 21', should normally be greater than the thickness of a terminal 17, but less than the combined thickness of a terminal and the layer of solder associated therewith, when employed in an arrangement as illustrated in FIGS. 1–3. This structural relationship insures that sufficient space will exist between the leads 15 and the adjacent wall areas of the respectively associated grooves 21 so as to allow the molten solder to be drawn at least in part by capillary attraction not only around the sides of each lead 15, but upwardly over the top thereof so as to completely envelop the leads (see FIG. 3).

The resultant reflow action of the molten solder, as allowed by the specially shaped grooves 21, produces connections which advantageously exhibit profiles in the form of fillets 26', each completely enveloping the associated wire lead 15 and being feathered on either side thereof in approaching the upper surface of the aligned terminal 17 or other mating base metal to which it is bonded.

Another advantage realized by the use of the peculiarly dimensioned and contoured elongated grooves 21 is that the resulting leg portions 23 of the member 10 when abutting against the upper surface of the circuit board 18, prevent any molten solder from bridging across or shorting out adjacent wire leads, terminals or printed circuit paths associated therewith.

As the temperature which a given material attains when heated by infrared radiation varies as a function of the material's emissivity, a desirable temperature distribution can be established in the various materials to be heated in accordance with the principles of the present invention such that plastic insulation on unstripped wire leads, for example, can be completely volatilized at a much higher temperature than that desired and simultaneously generated in the molten solder, bare leads and terminals. By way of example, in one typical application wherein the insulation on the leads to be soldered comprises polyurethane, the insulation, having a much higher emissivity than the reflective solder, volatilized at approximately 700° F. Conversely, the heat generated in the solder was only sufficient for it to attain a satisfactory molten state of approximately 500° F., so as to effect a reliable reflow solder connection of the type described hereinabove.

In accordance with another aspect of the invention, preferably the upper surface of the quartz radiant energy transmissive member 10 can be readily masked to be selectively opaque and transparent to radiant energy. Opaque areas are readily formed on the upper surface of member 10, for example, by a grinding operation or by applying a reflective coating thereon, such as gold, in accordance with a desired pattern. The formation of such patterned opaque and transparent areas can greatly facilitate radiant energy heating of a plurality of closely spaced, minute areas which may not necessarily be along a straight line. A pattern of transparent and opaque areas are shown and identified on the upper surface of the member 10 in FIGS. 1–3 by numerals 27 and 28, respectively.

Selective masking of the quartz member, of course, not only minimizes the possibility of deleterious heat reaching circuit board areas and components that may be positioned very close to the connection areas, but such selective channeling of the radiant energy can also be employed to establish a very particular temperature distribution between the various materials to be joined. Such tailored, temperature distributions could, of course, be of significance not only in reflow soldering applications, but in certain brazing, sealing or curing operations.

The use of quartz as the material for the radiant energy transmissive member is advantageous not only because of its light transmitting efficiency and thermal conductance characteristics, but also because of its machining properties, albeit it is a somewhat fragile material which must still be handled with care. Notwithstanding the advantages of quarts for the particular applications described herein, particularly with respect to the use of radiant energy in the ultraviolet and visible spectrum, and in the infrared region in wave lengths less than 7.0 microns, other materials such as glass Vycor and sapphire can also be selectively employed in many applications. In cases where it is desirable to use radiant energy in the infrared spectrum above wave lengths of 7.0 microns, rock salt, sylvine (potassium chloride) and fluorite are materials which also exhibit satisfactory transmissive properties in this spectral region.

It is to be understood, of course, that the reflow soldering methods and radiant energy transmissive members and systems embodied in this invention are not necessarily restricted to reflow soldering, as the invention may also have utility in other material joining applications, such as those which employ flowable adhesive cements and heat-setting plastic bonding materials. The invention could also have application in situations where radiant energy generated heat is capable of melting at least a portion of one contacting element of one material into a flowable or molten state in the area to be bonded, with the material in such a state exhibiting sufficient flowability to be drawn by force and/or capillary attraction about a portion of another solidified element of a different material so as to produce a reliable bond therebetween.

FIGS. 4–7 illustrate another embodiment of a selective masked radiant energy transmissive member 40 embodying features of the present invention. Member 40 distinguishes from member 10 of FIGS. 1–3 primarily by having a plurality of lead aligning and confining grooves 41 formed therein which have outer regions 41' of rectangular cross section and central inner regions 41'' which are V-shaped in cross section. In all other respects the radiant energy transmissive member 40 is essentially identical to member 10, with like reference numerals being used to identify the other common features relative to both member 40 and the solder connectible structure associated therewith.

Figure 4:
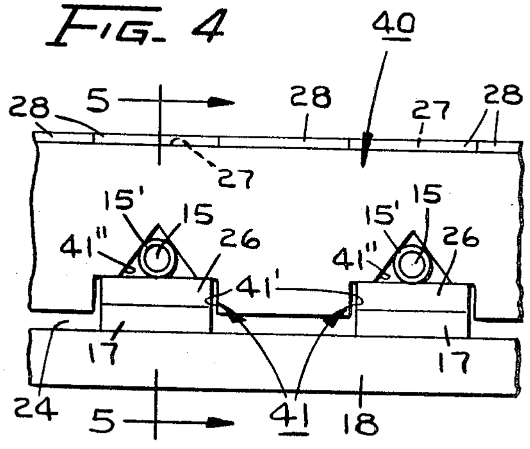
FIGS. 4–7 illustrate another embodiment of a radiant energy transmissive member in accordance with the principles of the present invention, FIGS. 4 and 5 illustrating enlarged, fragmentary side elevational and cross-sectional views, respectively, of the transmissive member relative to a pair of leads and respectively associated and aligned printed circuit board terminals prior to being reflow soldered, and FIGS. 6 and 7 illustrating in views respectively corresponding with FIGS. 4 and 5, the relationship between the transmissive member, leads and terminals after reflow solder connections have been made in accordance with the invention.
Figure 6:
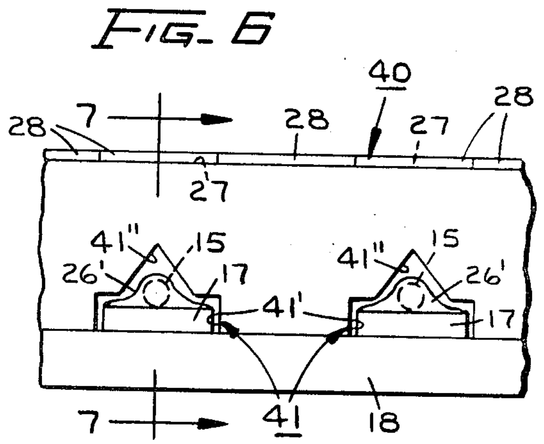
Figures 5, 7:
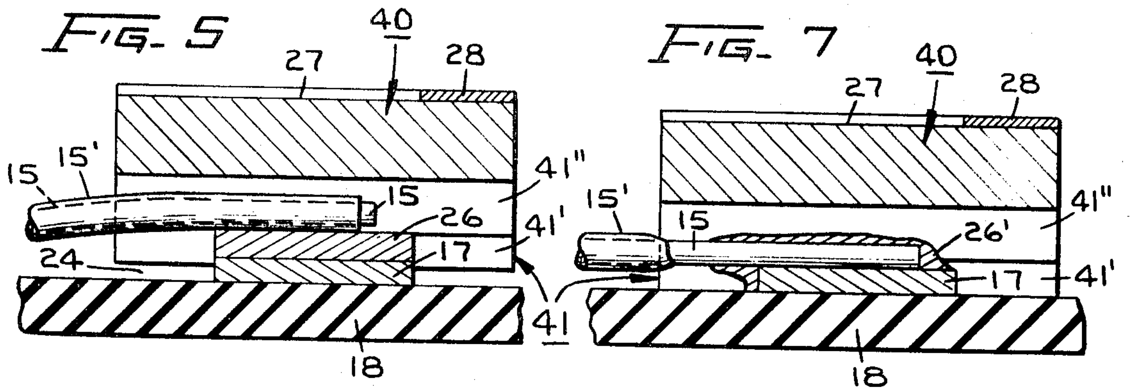

FIGS. 4 and 5 illustrate member 40 relative to the typical positional relationship between insulated leads 15, terminals 17 and layers of solder 26 for two connections before a reflow soldering operation, with FIGS. 6 and 7 illustrating the same relationship after a reflow soldering operation. It can be readily seen from a comparison of FIGS. 5 and 7 that an end portion of the insulating covering 15' on the particular lead shown in FIG. 5 is cleanly volatilized when heated, in accordance with the principles of the present invention, in the area of the reflow solder connection, as shown in FIG. 7. Obviating the insulation stripping operation normally required heretofore is of particular importance in applications where large numbers of leads must be soldered in apparatus on a continuous mass production basis.

Figure 8:
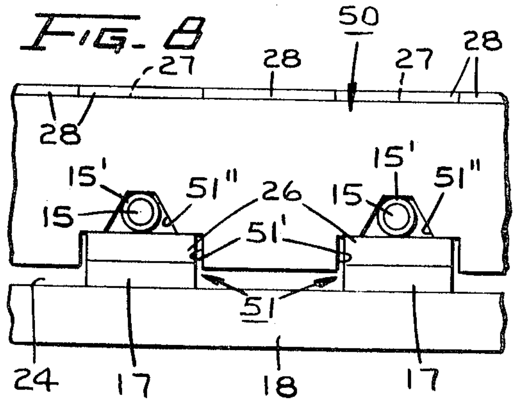
FIGS. 8 and 9 illustrate an additional preferred embodiment of the radiant energy transmissive member relative to a printed circuit board reflow soldering application.
Figure 9:
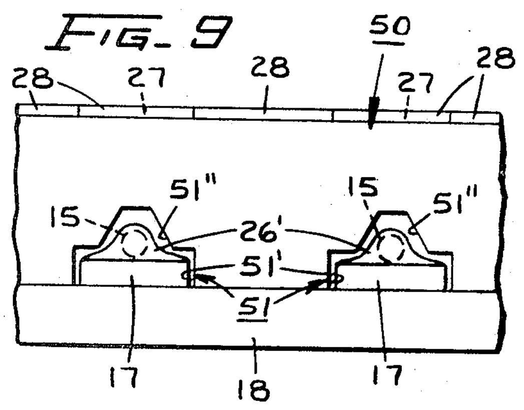

FIGS. 8 and 9 illustrate a selectively masked radiant energy transmissive member 50 which is still another variation of members 10 and 40. Member 50 is formed with grooves 51 having outer regions 51' of rectangular cross section and central inner regions 51'' which are essentially trapezoidal or three-sided in cross section. In all other respects member 50 is also essentially identical to members 10 and 40, with like reference numerals again being used to identify the other common features relative to both member 50 and the solder connectible structure associated therewith.

It should be understood that all of the lead confining groove configurations illustrated in radiant energy transmissive members 10, 40 and 50 afford an efficient and reliable way of soldering or bonding large arrays of even extremely fine gauge wires to associated terminals, and under demanding requirements, such as when extremely close spacings are dictated. This may often be the situation in thin film, integrated circuit and large scale integration (LSI) applications. In one typical miniaturized core memory circuit application, 40 AWG gold plated copper wire leads having insulation coverings of polyurethane and nylon were reflow soldered to 0.0027 inch thick terminals with 0.038 inch centers, and having 0.0025–0.003 inch thick solder coatings, all supported on a glass epoxy circuit board substrate.

The larger the number of wires bonded at one time, of course, the more advantageous are the methods and apparatus of the present invention, because the actual time required to bond one wire or 1,000 wires, for example, remains constant. The basic constraints imposed upon the number of wires to be soldered or bonded simultaneously are (a) the length of the radiant energy lamp and (b) the economical feasibility of grinding the required number of grooves in a given reflow soldering member.

As previously discussed, by masking the radiant energy transmissive members so as to make them only selectively transmissive to radiant energy, localized heating over only precisely controlled areas is readily achieved. When this feature is combined with the inherent thermal conductivity characteristics of the members, which allows them to also function as heat sinks, undesired or deleterious heat can be readily prevented from reaching structure and devices in close proximity to the specific areas to be reflow soldered. Such control, of course, can be even more advantageously tailored to a particular soldering application when a temperature distribution between the elements being soldered is also taken into consideration, based on the function of the emissivity of each of the materials involved.

I claim:

1. For use in a reflow bonding system for permanently joining adjacent portions of at least first and second elements supported on a common base:

a heat transmissive member having at least one groove formed in one surface thereof to confine initially at least a part of at least the first element portion to be bonded, said groove being dimensioned and contoured so as to provide a wall area which initially contacts the first element portion, and which subsequently, at least in part, allows the establishment of a space relative to at least the first element portion during the formation of a reflow bonded connection, said space being sufficient to allow a layer of bonding material capable of acquiring a flowable state when subjected to heat, when pre-deposited initially in an area relative to the adjacent portions of the first and second elements so as also to be confirmed within said groove, to be drawn at least in part by capillary attraction, upon being heated through said member to a flowable state, through said established space, over the first element portion, and merging on either side thereof with the adjacent portion of the second element as to produce a reliable reflow bonded connection between the first and second elements, and Means for generating and directing concentrated radiant energy through said transmissive member to heat the bonding material confined within said groove to a flowable state in the area of the first and second portions to thereby produce a reflow bonded connection therebetween.

2. In a radiant energy reflow soldering system for making solder connections between adjacent portions of at least first and second mating elements:

a radiant energy transmissive member exhibiting a thermal conductivity sufficient to also function as a heat sink, said member having at least one longitudinally extending groove formed and dimensioned in one surface thereof to confine initially at least a part of at least the first element portion to be reflow soldered, said groove subsequently allowing the establishment of a space which varies between the wall area thereof and the first element portion during the formation of a reflow solder connection, said space being sufficient to allow a layer of solder, when pre-deposited initially in an area relative to the adjacent portions of the first and second elements so as also to be confined within said groove, to be drawn at least in part by capillary attraction, upon being heated to a molten state, through said established space, around the periphery of the first element portion, and merging on either side thereof with the adjacent portion of the second element so as to produce a reliable reflow solder connection therebetween, and means for generating and directing radiant energy through said transmissive member to heat the solder confined within said groove to a molten state in the area of the first and second element portions to thereby produce a reflow solder connection therebetween.

3. In a reflow soldering system in accordance with claim 2, said radiant energy transmissive member having a plurality of spaced grooves formed therein for aligning and confining a plurality of said first elements to be reflow soldered simultaneously with a plurality of respectively aligned second elements, and said member further exerting a force against said first elements in the direction of said adjacent second elements at least until the solder, pre-deposited relative to the first and second elements, has been heated to a molten state, said grooves thereafter confining both said first and second elements until completion of a reflow solder connection.

4. In a reflow soldering system in accordance with claim 3, said radiant energy transmissive member being composed of quartz, and said grooves being contoured and dimensioned to accommodate said first elements when in the form of wire leads and said second elements when in the form of terminals of an electrical circuit.

5. In a reflow soldering system in accordance with claim 2, said transmissive member further having masked areas selectively formed on at least one surface thereof which are opaque to radiant energy, said unmasked areas thereby defining a precise transparent pattern through which the radiant energy is transmitted.

6. In a reflow soldering system in accordance with claim 2, said groove in said member being contoured to have an outer region of substantially rectangular cross section and an inner, communicating central region which is dome-shaped in cross section, said groove being dimensioned such that the walls defining said dome-shaped region initially contacts the first element portion to be reflow soldered, and said rectangular region subsequently accommodates an aligned second element portion prior to the completion of a reflow solder operation.

7. In a reflow soldering system in accordance with claim 2, said groove in said member being contoured to have an outer region substantially rectangular cross section and an inner, communicating central region which is V-shaped in cross section, said groove being dimensioned such that the walls defining said V-shaped region initially contact the first element portion to be reflow soldered, and said rectangular region subsequently accommodates an aligned second element portion prior to the completion of a reflow solder operation.

8. In a reflow soldering system in accordance with claim 2, said groove in said member being contoured to have an outer region of substantially rectangular cross section and an inner, communicating central region which is trapezoidal in cross section, said groove being dimensioned such that at least two walls defining said trapezoidal region initially contact the first element portion to be reflow soldered, and said rectangular region subsequently accommodating an aligned second element portion prior to the completion of a reflow solder operation.

9. In a reflow soldering system in accordance with claim 6, said radiant energy transmissive member being composed of quartz, and further having masked areas selectively formed on at least one surface thereof which are opaque to radiant energy, said unmasked areas thereby defining a precise transparent pattern through which the radiant energy is transmitted.

10. In a reflow soldering system in accordance with claim 7, said radiant energy transmissive member being composed of quartz, and further having masked areas selectively formed on at least one surface thereof which are opaque to radiant energy, said unmasked areas thereby defining a precise transparent pattern through which the radiant energy is transmitted.

11. In a reflow soldering system in accordance with claim 8, said radiant energy transmissive member being composed of quartz, and further having selective masked areas formed on at least one surface thereof which are opaque to radiant energy, said unmasked areas thereby defining a precise transparent pattern through which the radiant energy is transmitted.

12. A method of producing a reflow bonded connection between adjacent portions of at least first and second elements, comprising the steps of:

forming at lest one groove in one surface of a heat transmissive member to confine at least a part of at least the first element portion to be reflow bonded, said groove being contoured and dimensioned so as to provide a wall area which initially contacts the first element portion, and which subsequently, at least in part, allows the establishment of a space relative to at least the first element portion during the formation of a reflow bonded connection;

pre-depositing a layer of bonding material in an area relative to the adjacent portions of the first and second elements so as to be confined within said grooves, said bonding material being capable of acquiring a flowable state when subjected to heat, and transmitting concentrated heat through said transmissive member so as to impinge upon and heat said bonding material to a flowable state sufficient to cause said bonding material to be drawn at least in part by capillary attraction through said established space, over the first element portion, and merging on either side thereof with the adjacent portion of said second element so as to produce a reliable reflow bonded connection therebetween.

13. A method of producing a reflow bonded connection between adjacent portions of at least first and second elements, comprising the steps of:

pre-coating the portion to be reflow bonded of at least one of said first and second elements with a bonding material capable of acquiring a flowable state when subjected to heat;

confining at least a part of the first element portion to be bonded within a groove formed in a heat transmissive member, said groove being dimensioned and contoured so as to provide a wall area which initially contacts the first element portion, and which subsequently, at least in part, allows the establishment of a space between the confined portion of the first element and the adjacent wall area defining the groove during the formation of a reflow solder connection, and transmitting concentrated heat through said transmissive member so as to impinge upon and heat said bonding material to a flowable state, while force is simultaneously exerted against said first element in the direction of said second element for at least a portion of the time during which heat is applied thereto, the combination of said heat and force resulting in said bonding material being drawn at least in part by capillary attraction through said established space, over the first element portion, and merging on either side thereof with the adjacent portion of the second element so as to produce a reliable reflow bonded connection therebetween.

14. A method of producing a reflow soldered connection between adjacent portions of at least first and second elements, comprising the steps of:

forming at least one longitudinally extending groove in one surface of a radiant energy transmissive member exhibiting a thermal conductivity sufficient to also function as a heat sink, said groove being contoured and dimensioned so as to align, confine and initially have wall contact with at least a part of at least said first element to be reflow soldered, and to subsequently allow a space to be established between at least the first element portion and the adjacent wall area of said groove, said space being variable during a period starting with the solder reaching a molten state and ending when the solder re-solidifies to form a reflow solder connection;

pre-depositing a layer of solder in an area relative to the adjacent portions of the first and second elements so as to be confined within said groove, and transmitting radiant energy through said transmissive member so as to impinge upon and heat said solder confined within said groove to a molten state, while force is simultaneously exerted against said first element in the direction of said second element for at least a portion of the time during which heat is applied thereto, the combination of said heat and force causing said solder to be drawn at least in part by capillary attraction through said established space, around the periphery of said first element portion, and merging on either side thereof with the adjacent portion of said second element so as to produce a reliable reflow solder connection between said first and second elements.

15. A method in accordance with claim 14 wherein said radiant energy transmissive member is formed with a plurality of said groove so as to accommodate and effect the simultaneous, multiple reflow soldering of a plurality of sets of first and second elements.

16. A method in accordance with claim 14 wherein said radiant energy transmissive member has selective masked areas formed on at least one surface thereof which are opaque to radiant energy, said unmasked areas thereby defining a precise transparent pattern through which the radiant energy is transmitted through said member.

17. A method of producing a reflow solder connection between adjacent portions of at least first and second elements, comprising the steps of:

solder coating the portion to be reflow soldered of at least one of said first and second elements;

confining at least a part of the first element portion to be reflow soldered within a groove formed in a radiant energy transmissive member, said groove being dimensioned and contoured so as to provide a wall area which initially contacts the first element portion, and which subsequently, at least in part, allows the establishment of a space between the first element portion and the adjacent wall area of the groove during the formation of a reflow solder connection, and transmitting radiant energy through said transmissive member so as to impinge upon and heat the solder precoated on at least one of the first and second elements to a molten state, while force is exerted by said member against said first element in the direction of said second element, the combination of said heat and force resulting in said solder being drawn at least in part by capillary attraction through said established space, over the first element portion, and merging on either side thereof with the adjacent portion of the second element so as to effect a reliable reflow soldered connection therebetween.

18. A method of producing multiple reflow solder connections between adjacent portions of at least first and second elements which together form one of a plurality of sets of elements, comprising the steps of:

solder coating the portion to be reflow soldered of at least one of said first and second elements of each set;

forming a plurality of longitudinally extending grooves in one surface of a radiant energy transmissive member exhibiting a thermal conductivity sufficient to also function as a heat sink, each of said grooves being positioned, contoured and dimensioned so as to align, confine and initially have wall contact with at least a part of at least the portion of the associated first element to be reflow soldered, and to subsequently allow a space to be established between at least the first element portion and the adjacent wall area of the associated groove during the formation of a reflow solder connection therein, and transmitting radiant energy through said transmissive member so as to impinge upon and heat said solder confined within each groove to a molten state, while force is exerted against all of said first elements in the direction of said respectively adjacent second elements for at least a portion of the time during which heat is applied thereto, the combination of said heat and force causing said solder associated with each set of first and second elements to be drawn at least in part by capillary attraction through said established space of the associated groove, around the periphery of the first element portion confined therewithin, and merging on either side thereof with the adjacent portion of said second element so as to produce a reliable reflow solder connection between said first and second element of each set in each of said grooves simultaneously.

* * * * *

L-566-PT
(6-69)

UNITED STATES PATENT OFFICE
CERTIFICATE OF CORRECTION

Patent No. 3,657,508 Dated April 18, 1972

Inventor(s) W. R. Studnick

It is certified that error appears in the above-identified patent and that said Letters Patent are hereby corrected as shown below:

The date filed "Nov. 18, 1070" should read --Nov. 18, 1970--. Abstract, line 6, "or terminals" should follow "extremities". Column 1, line 36, "prevents" should read --presents--. Column 1, line 38, "Electrons" should read --Electron--. Column 5, line 42, "comprises" should read --comprised--. Column 6, line 29, "selective" should read --selectively--. Column 7, line 50, "so" should follow "element" and precede "as". Column 8, line 40, "walls" should read --wall--. Column 8, line 47, "of" should precede "substantially". Column 9, line 10, "lest" should read --least--. Column 9, line 20, "grooves" should read --groove--. Column 10, line 19, "groove" should read --grooves--.

Signed and sealed this 28th day of November 1972.

(SEAL)
Attest:

EDWARD M.FLETCHER,JR.
Attesting Officer

ROBERT GOTTSCHALK
Commissioner of Patents